United States Patent
Chen et al.

(10) Patent No.: US 6,291,256 B1
(45) Date of Patent: Sep. 18, 2001

(54) METHOD OF MANUFACTURING NON-REGROWTH DISTRIBUTED FEEDBACK RIDGE SEMICONDUCTOR

(75) Inventors: Nong Chen; Yoshiaki Watanabe; Koyoshi Takei; Kiyofumi Chikuma, all of Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 09/399,768

(22) Filed: Sep. 21, 1999

Related U.S. Application Data

(62) Division of application No. 08/900,171, filed on Jul. 25, 1997, now Pat. No. 5,982,804.

(30) Foreign Application Priority Data

Aug. 1, 1996 (JP) .................................................. 8-203957
Jan. 13, 1997 (JP) .................................................. 9-003743

(51) Int. Cl.$^7$ .................................................. H01L 21/00
(52) U.S. Cl. .................................................. 438/32; 438/22
(58) Field of Search .................................................. 438/22, 32, 39, 438/40, 41

(56) References Cited

U.S. PATENT DOCUMENTS

| | | |
|---|---|---|
| 5,224,115 | 6/1993 | Taylor et al. . |
| 5,329,542 * | 7/1994 | Westbrook .............................. 372/96 |
| 5,727,015 * | 3/1998 | Takahashi et al. ..................... 372/96 |
| 5,870,419 | 2/1999 | Nakayama . |
| 5,982,804 * | 11/1999 | Chen et al. ............................. 372/96 |
| 5,991,322 * | 11/1999 | Takiguchi ............................... 372/50 |

* cited by examiner

*Primary Examiner*—David Nelms
*Assistant Examiner*—David Nhu
(74) *Attorney, Agent, or Firm*—Fish & Richardson P.C.

(57) ABSTRACT

There is provided a method of manufacturing a DFB semiconductor laser in which a laser substrate having a cladding layer which is a material for a ridge stripe stacked on an active is formed. The cladding layer as a material for a ridge stripe is etched to form a ridge stripe having flat portions on both sides thereof and a flat top portion protruding therefrom. A protective film and a resist layer are formed to cover the flat portions on both sides and the flat upper surface. A latent image of a grating having a periodic structure is formed in the direction in which the ridge stripe extends is formed on the resist layer. The resist layer is developed and the flat portions on both sides are etched to form a grating on both lateral portions and to remove the protective film. An electrode is formed on the flat top portion, the interface between the ridge strip and the electrode being a smooth surface.

12 Claims, 10 Drawing Sheets

METHOD OF MANUFACTURING NON-REGROWTH DISTRIBUTED FEEDBACK RIDGE SEMICONDUCTOR

This application is a division of U.S. application Ser. No. 08/900,171, filed Jul. 25, 1997, which issued as U.S. Pat. No. 5,982,804 on Nov. 9, 1999.

BACKGROUND OF THE INVENTION

1. Field of the Invention

The present invention relates to a non-regrowth distributed feedback (DFB) semiconductor laser and a method of manufacturing the same and, more particularly, to a method of fabricating diffraction gratings on both sides of a ridge.

2. Description of the Related Art

DFB semiconductor lasers are known as devices which can be used in the fields of optical communication systems such as optical CATVs, pumping light sources for SHG short-wave lasers for high-density information recording or small solid-state lasers, and optical measurement. Conventional distributed feedback semiconductor lasers are formed using two or more steps of epitaxial growth. In a ridge type DFB semiconductor laser formed using two or more steps of epitaxial growth, a grating (diffraction grating) is provided in a laser waveguide layer and thereafter another layer is formed on the waveguide on an epitaxial growth basis.

Recently, in order to avoid the complicated epitaxial growth in two or more steps, the so-called non-regrowth distributed feedback semiconductor lasers have been developed which are fabricated using one step of epitaxial growth, i.e., which does not involve the second epitaxial growth.

For example, in R. D. Martin et al. "CW Performance of an InGaAs-GaAs-AlGaAs Laterally-Coupled Distributed Feedback (LC-DFB) Ridge Laser Diode" IEEE Photonics Technology Letters, Vol. 7, No. 3, pp 244–246, March 1995, an InGaAs-GaAs-AlGaAs distributed feedback semiconductor laser is disclosed in which an active layer and a cladding layer are formed on a substrate by means of epitaxial growth; a ridge stripe is formed on the cladding layer; and a grating is provided on the top portion of the ridge stripe and on flat portions on both sides thereof. In methods of manufacturing such a non-regrowth distributed feedback semiconductor laser, the grating is formed on the entire region of the substrate including the top portion of the ridge type waveguide by means of direct writing with electron beams (EB).

As shown in FIG. 1, however, an unnecessary grating 3 exists in the region of a contact layer on the top portion of a ridge 1 into which a current injected immediately after gratings 2 are formed on flat portions on both sides of the ridge 1. The grating 3 on the top portion of the ridge may obstruct the step of forming an electrode to make connection to the contact layer region. This can result in poor contact and can adversely affect the characteristics of the device.

SUMMARY OF THE INVENTION

The present invention confronts the above-described problem, and it is an object of the present invention to provide a method of manufacturing non-regrowth DFB semiconductor lasers, especially InP type layers, including the step of fabricating simplified gratings and a non-regrowth DFB semiconductor laser free from poor contact.

The object is achieved by a method of manufacturing a DFB semiconductor laser described below, in which a laser substrate having a cladding layer which is a material for a ridge stripe stacked on an active layer is formed. The cladding layer as a material for a ridge stripe is etched to form a ridge stripe having flat portions on both sides thereof and a flat top portion protruding therefrom. A protective film and a resist layer are formed to cover the flat portions on both sides and the flat upper surface. A latent image of a grating having a periodic structure is formed in the direction in which the ridge stripe extends is formed on the resist layer. The resist layer is developed and the flat portions on both sides are etched to form a grating on both lateral portions and to remove the protective film. An electrode is formed on the flat top portion, the interface between the ridge strip and the electrode being a smooth surface.

In a first aspect of the invention, the method of manufacturing a distributed feedback ridge semiconductor laser having a ridge stripe on an active layer and a periodic structure in a direction in which the ridge stripe extends, which comprises the steps of:

forming a laser substrate comprising a cladding layer made of a material for a ridge stripe and a contact layer stacked in order on an active layer;

forming two lateral flat portions from said cladding layer and said contact layer and forming a ridge stripe protruding from said lateral flat portions and having a flat top portion;

forming a mask such as a protective film and a resist layer in order to cover said lateral flat portions and said flat top portion;

forming a latent image of a grating pattern having a periodic structure in the direction in which the ridge stripe extends on said resist layer and forming a grating pattern by developing said resist layer;

etching said grating pattern to form a grating made of said material for the ridge stripe on or in said cladding layer in regions other than said flat top portion;

removing said protective film to form an insulating layer on a surface of said grating layer and said flat top portion; and performing etching to expose only said flat top portion on said insulating layer and, thereafter, forming an electrode on said flat top portion.

In a second aspect of the invention of the method of manufacturing a semiconductor laser, wherein said step of patterning includes the step of forming said latent image using an electron beam writing process.

In a third aspect of the invention of the method of manufacturing a semiconductor laser, wherein said active layer is a bulk layer, a single quantum well layer, or a multiple quantum well layer mainly composed of $In_{1-x}Ga_xAs_{1-y}P_y$ (x and y represent a decimal fraction); said cladding layer is InP; and said contact layer is InGaAsP or InGaAs.

In a fourth aspect of the invention of the method of manufacturing a semiconductor laser, wherein when wet etching is employed for said step of forming the grating, selective wet etching of InP is performed using a hydrochloric acid type etchant such that the direction of said ridge stripe extends substantially coincides with a $[0\overline{1}1]$-direction of said laser substrate.

In a fifth aspect of the invention of the method of manufacturing a semiconductor laser, wherein when dry etching is employed in said step of forming the grating, in said step of forming the mask, said protective film is left on only said flat top portion of the ridge stripe except the two lateral flat portions, and then said resist layer is entirely formed on said protective film and said two lateral flat portions, and then the dry etching is performed in accordance with the difference in thickness between a total both of the resist layer and the protective film, and the only one single of the resist layer.

In sixth aspect of the invention, the distributed feedback ridge type semiconductor laser having a ridge stripe on an active layer and a periodic structure in a direction in which the ridge stripe extends, which comprises:

a laser substrate including a cladding layer made of a ridge stripe material and a necessary contact layer in this order stacked on an active layer;

two lateral flat portions formed from said cladding layer and said contact layer;

a ridge stripe protruding from said lateral flat positions and having a flat top portion;

a protective film and a resist layer formed in order to cover said lateral flat portions and said flat top portion;

a grating layer formed by developing said resist layer on which a latent image of a grating pattern having a periodic structure in the direction in which the ridge stripe extends has been formed;

a grating layer made of said ridge stripe material formed by etching said grating pattern on or in said cladding layer in regions other than said flat top portion;

an insulating layer formed on a surface of said grating layer and said flat top portion such that said flat top portion is exposed; and an electrode formed on said flat top portion to produce an interface between said ridge stripe and said electrode, said interface being a smooth surface.

According to the present invention, in order to improve the efficiency of current injection into a laser device, no grating is formed on the contact layer on the top portion of the ridge, and a grating is provided only on the regions on both sides thereof (the regions excluding the flat top portion), and the grating can be uniformly even at the step portion. Specifically, the present invention takes advantage of the characteristics of an epitaxial wafer for InGaAsp/InP lasers to provide a simple and reliable method of selective wet etching in which grating structures for lateral optical coupling can be formed only on the regions on both sides of the ridge, thereby making it possible to manufacture non-regrowth DFB ridge semiconductor lasers with high yield, at low cost, and with high quality.

DETAILED DESCRIPTION OF PREFERRED EMBODIMENTS

The inventors of the present invention fabricated an $In_{1-x}Ga_xAs_{1-y}P_y/InP$ based non-regrowth DFB ridge type semiconductor laser on a substrate made of indium-phosphorus (InP) by means of vapor phase epitaxial growth, more particularly, metal organic chemical vapor deposition (MOCVD) using a gas of a organometallic compound as the material and conceived the present invention as a result of various studies to find a method of surface processing that provides a device having preferable emission characteristics in which the interface between the ridge stripe and the electrode is a smooth surface.

A description will now be made with reference to FIGS. 2 through 10 on preferred embodiments of the method of the invention for fabricating a semiconductor laser made of $In_{1-x}Ga_xAs_{1-y}P_y$ ($0 \leq x<1$, $0 \leq y<1$) on an InP substrate.

Figure 1:
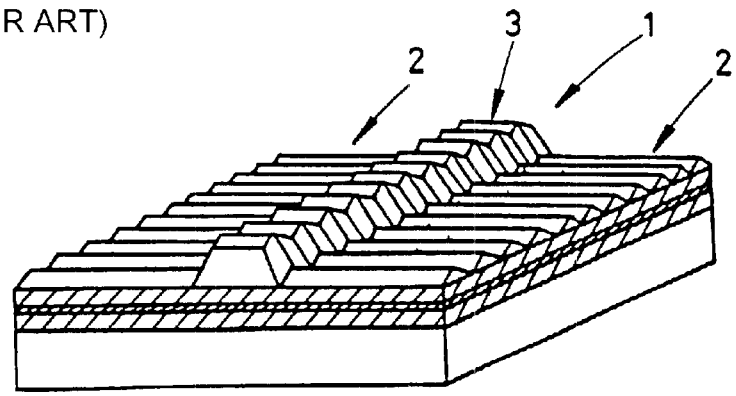
FIG. 1 is a schematic perspective view of a substrate of a laser at a step of manufacturing a conventional non-regrowth DFB semiconductor laser.
Figure 2:
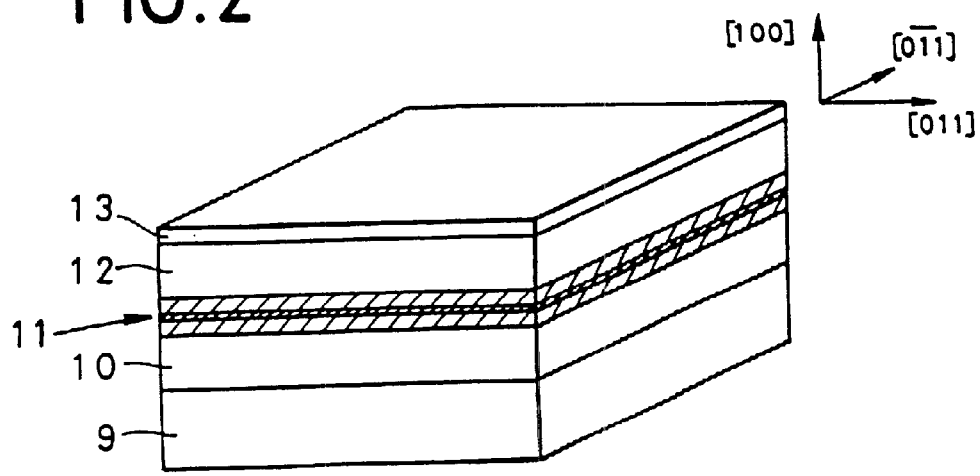
FIGS. 2 through 10 are schematic perspective views of a substrate of a laser at steps of manufacturing a non-regrowth DFB semiconductor laser according to an embodiment of the present invention.

As shown in FIG. 2, a wafer of an InP crystalline substrate having predetermined plane orientation (100) is first prepared; chemical etching is performed to clean the surface; and an SCH (separate confinement heterostructure) active layer region, a cladding layer as a ridge stripe material, contact layer and the like are formed using predetermined processes such as epitaxial growth, liquid phase epitaxial growth, metal organic chemical vapor deposition, or molecular beam epitaxial growth. For example, a cladding layer 10 of n-InP and an SCH active layer 11 of $In_{1-x}Ga_xAs_{1-y}P_y$ are stacked on a (100)-plane of a $n^+$-InP substrate 9; a cladding layer 12 of a p-InP ridge stripe material is stacked on the active layer; and a contact layer 13 of p-InGaAsP or $p^+$-InGaAs is stacked on the cladding layer of a ridge stripe material. Thus, a laser substrate having a laser structure is formed.

Figure 3:
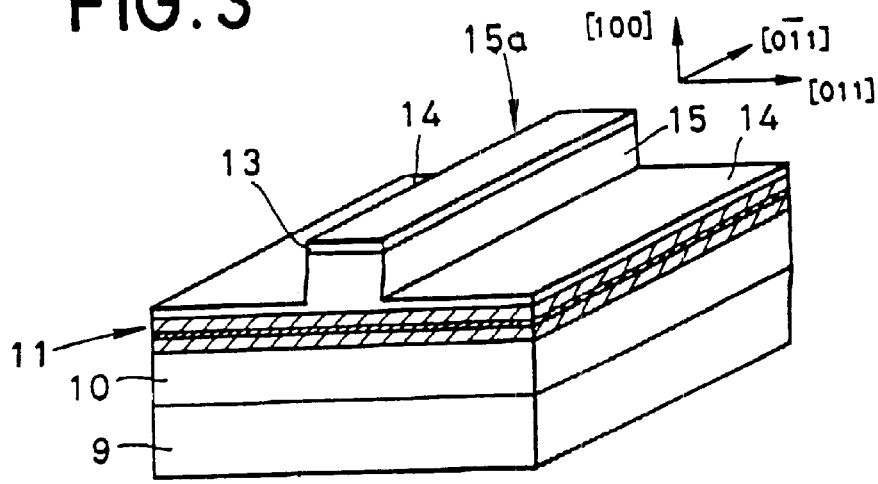

Next, as shown in FIG. 3, a predetermined stripe mask made of $SiO_2$, $TiO_2$ or the like is formed on the contact layer 13 to provide a ridge stripe which extends in a [0 $\overline{1}$1]-direction of the laser substrate, and the contact layer 13 and the cladding layer 12 of a ridge stripe material are etched using, for example, photolithography or the like to form two side flat portions 14 and a ridge stripe 15 protruding therefrom to a predetermined height and having a flat top portion 15a.

Figure 4:
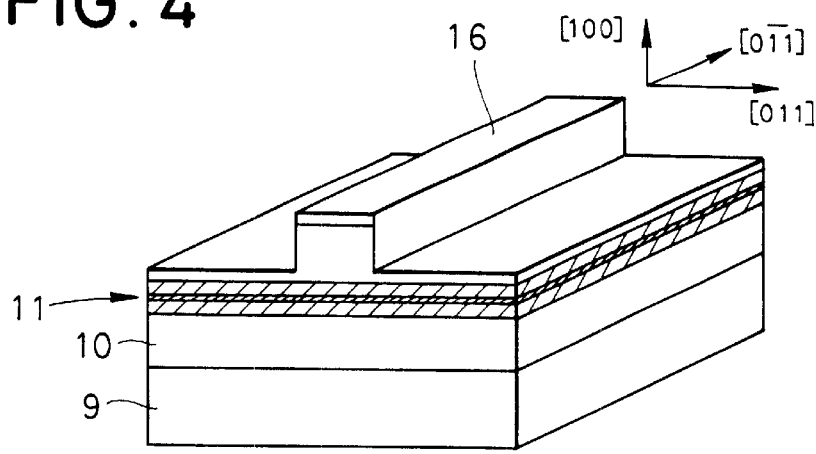

Next, as shown in FIG. 4, a protective film 16 made of $SiO_2$ or the like is formed over the two flat portions 14 and the flat top portion 15a. The protective film 16 prevents the desorption of phosphorus and also serves as an etching mask. The protective film 16 prevents the desorption of phosphorus and also serves as an etching mask. The protective film 16 is also effective in providing a uniform resist film for high resolution electronic beam (EB) writing at the next step which requires baking at a high temperature.

Figure 5:
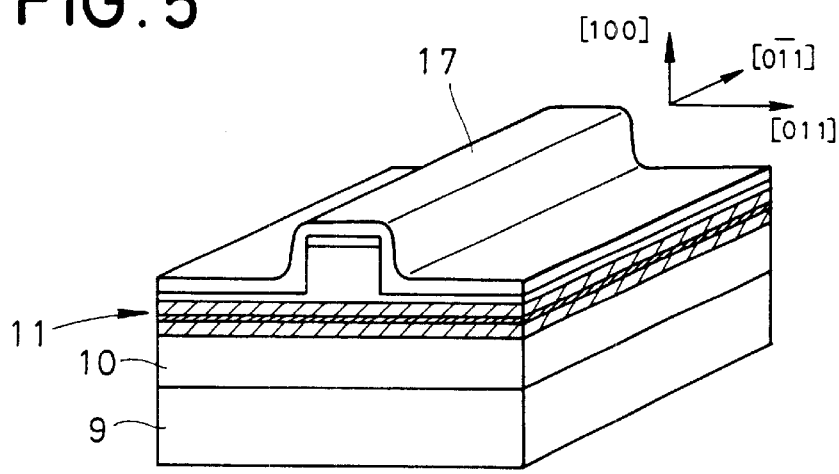

Next, as shown in FIG. 5, the protective film 16 is coated with the resist for EB writing that extends in the regions of both lateral flat portions and the flat top portion and, thereafter, baking is performed to form a resist layer 17.

Figure 6:
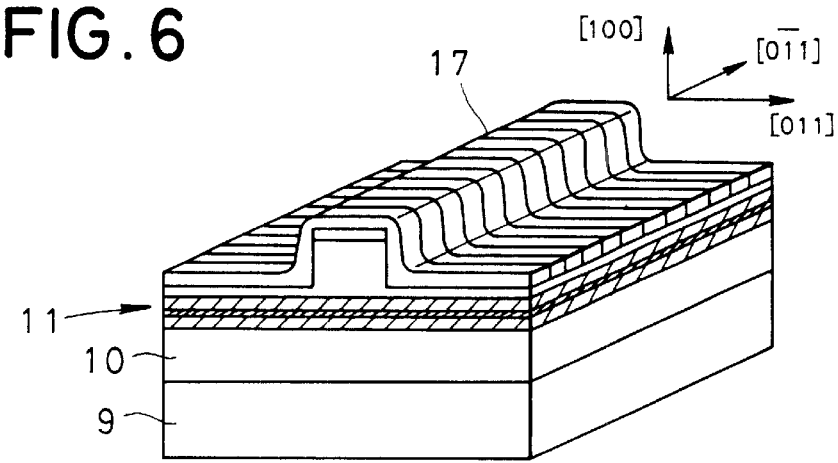

Then, as shown in FIG. 6, EB writing is performed on the entire surface including the top portion of the ridge stripe to provide lines which periodically extend in the direction of a [011] crystal orientation in accordance with a desired oscillation frequency of the laser, thereby forming a latent image of a grating in a periodic structure which undergoes a variation of shape having a period $\Lambda$ in the direction in which the ridge stripe extends (i.e., [0$\bar{1}$1]), on the resist layer 17. In a DFB semiconductor laser, in general, a periodic structure is formed which undergoes a variation in shape having a period $\Lambda$ in the direction in which the laser beam propagates. This results in a periodic variation of the index of refraction which in turn results in an increase in the reflectivity at a wavelength for which the phases of periodically reflected beams match (Bragg reflection), thereby causing laser oscillation. Therefore, the oscillation frequency of a distributed feedback semiconductor laser is determined by the period $\Lambda$ of the periodic structure and, in general, a single longitudinal mode is obtained if $\Lambda=m\lambda/2n$ is satisfied where m represents an integral number; $\lambda$ represents the oscillation wavelength (in vacuum); and n represents the index of refraction of the laser medium. While oscillation generally occurs in the vicinity of the wavelength of the Bragg reflection, the period $\Lambda$ is determined considering the refractive indices, thicknesses, and aspect ratios of the $In_{1-x}Ga_xAs_{1-y}P_y$ active layer and the cladding layer of the InP ridge stripe material, the reflectivity of the resonator (cleavage plane), and the lateral optical coupling coefficient.

Figure 7:
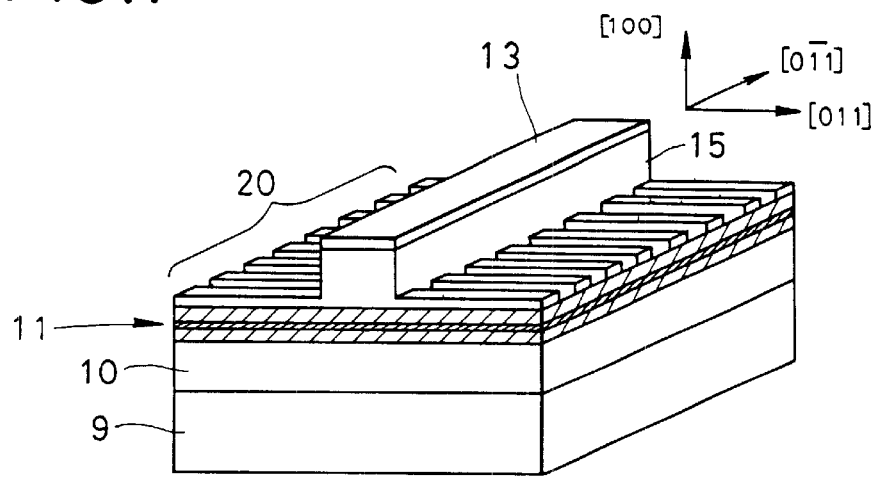

Next, as shown in FIG. 7, a step of forming gratings is carried out in which the grating on the resist layer 17 is transferred to the $SiO_2$ protective film 16 by means of $CF_4$ dry etching, and InP on both lateral flat portions is selectively etched using a hydrochloric acid type etchant, e. g., HCl: $H_2O$, to transform the lateral flat portions into gratings 20 and to remove the protective film 16.

Observation of an SEM picture taken on the result of the above-described grating formation step proves that grating structures having widths spanning the regions of the substrate on both sides of the ridge stripe and a period on the order of submicrometers are formed with uniformity maintained even in the region of the steps.

Figure 8:
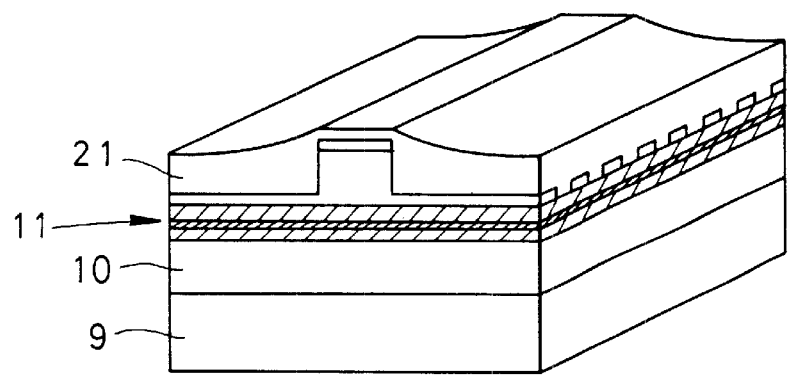

Next, as shown in FIG. 8, a silicon compound such as water-glass is applied to the entire region where the ridge stripe 15 and the gratings 20 are located and is cured to form an inorganic protective layer (or an insulating layer) 21. The inorganic protective layer 21 which is a protective film for blocking a current is formed thinner on the flat top portion of the ridge stripe than on the top portion of the gratings 20.

Figure 9:
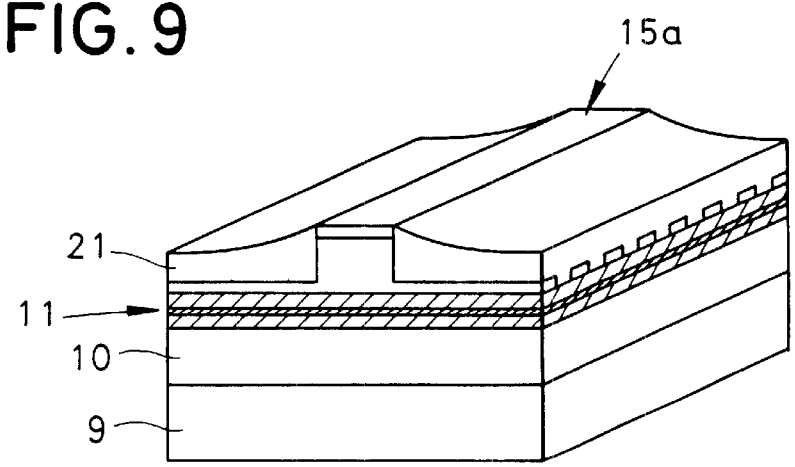

Thereafter, as shown in FIG. 9, the inorganic protective layer 21 is removed until the top portion 15a of the ridge stripe is exposed. It is possible to expose only the flat top portion 15a of the ridge stripe 15 by performing dry etching where there is a difference between the thicknesses of the inorganic protective film 21 on the flat top portion of the ridge stripe and on the top portion of the gratings 20. This is the formation of an electrode window using the so-called self-alignment process.

Figure 10:
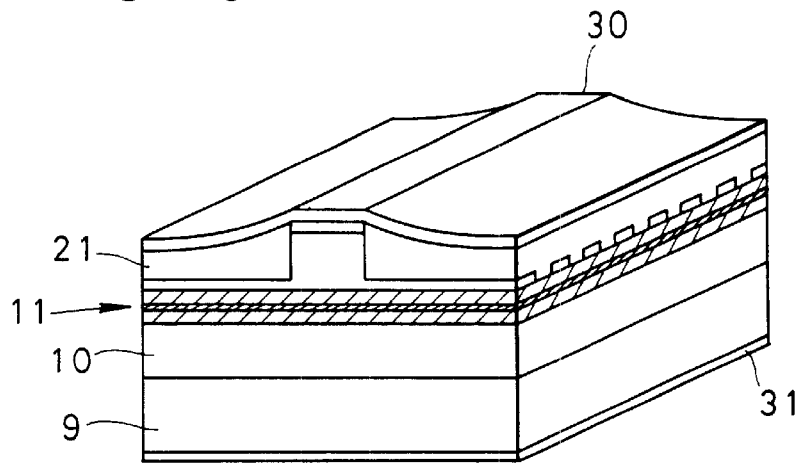

Next, as shown in FIG. 10, an electrode 30 is formed on the contact layer at the top portion 15a of the ridge stripe thus exposed. The ridge stripe top portion 15a is flat because there is no grating. It is therefore possible to form an electrode free from poor contact. Further, an opposite electrode 31 is formed on the opposite surface of the substrate 9. An ohmic contact metal having no rectifying property is chosen for those electrodes. In general, AuGeNi and CrAu are formed using vacuum deposition on the n- and p- sides, respectively. Thereafter, predetermined steps are performed to complete the device. In this laser, the active layer is constituted by the bulk, and the end faces are cleavage planes. The width of the ridge stripe is 5 $\mu$m and may be 2 $\mu$m or less if stronger coupling is desired. Although the grating is of third order, it may be of first order. The grating depth is one-fourth or one-third of the period $\Lambda$, but it may be smaller than one-third of the period.

In order to see the characteristics of a non-regrowth DFB semiconductor laser obtained as described above, an examination was made on spectral distribution showing the oscillation wavelength versus relative intensity and on the injected current versus light output. As a result, it was recognized that the non-regrowth DFB semiconductor laser allows highly efficient injection of a current into the device and provides single mode emission.

As described above, according to the present embodiment, a protective layer is provided on the entire region where the ridge stripe exists including the top portion thereof; patterns at predetermined intervals are exposed utilizing a writing process; and gratings with a predetermined period are formed using photolithography. As a result of the selective etching of InP described above, no grating is formed on the top of the ridge stripe to leave a smooth surface thereon, and a grating is formed only on the flat portions on both sides of the ridge stripe.

As another embodiment, steps of fabricating a grating as shown in FIGS. 11 through 15 may be performed on common materials for a laser.

First, there is provided an epitaxial substrate 110 having a predetermined plane orientation including an active layer 111, a cladding layer 112 made of a ridge stripe material, and a contact layer 113.

Figure 11:
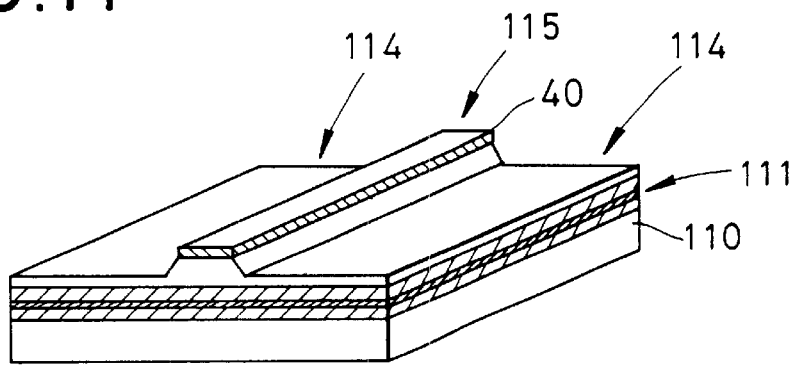
FIGS. 11 through 15 are schematic perspective views of a substrate of a laser at steps of manufacturing a non-regrowth DFB semiconductor laser according to another embodiment of the present invention.

Next, as shown in FIG. 11, etching is performed to form two lateral flat portions 114 and a ridge stripe 115 which protrudes therefrom to a predetermined height and which has a flat top portion 115a. If a selective wet etching process as described above is not available, an etching mask 40 is left on the contact layer 113 when the ridge stripe is formed.

Figure 12:
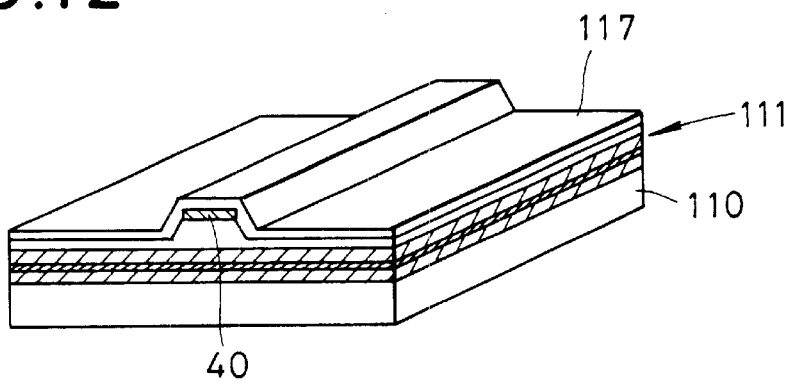

Next, as shown in FIG. 12, a coating of a resist for EB writing is provided to cover both lateral flat portions and the flat top portion and, thereafter, baking is performed to form a resist layer 117.

Figure 13:
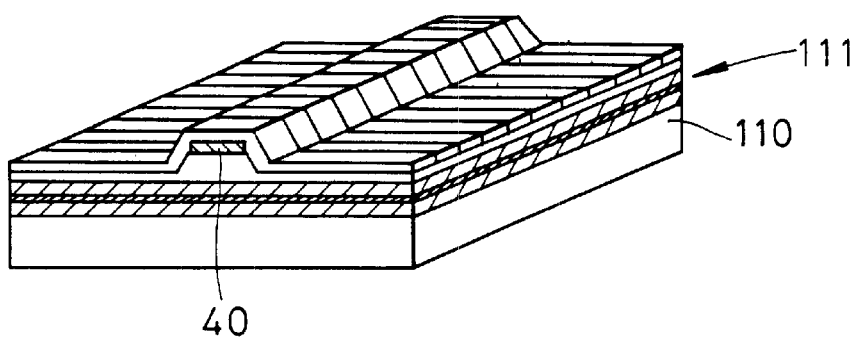

Then, as shown in FIG. 13, EB writing is performed on the entire surface including the top portion of the ridge stripe in a direction of crossing the ridge stripe in a periodic manner in accordance with a desired oscillation frequency of the laser, thereby forming a latent image of a grating having a periodic structure on the resist layer 117 in the direction in which the ridge stripe extends.

Figure 14:
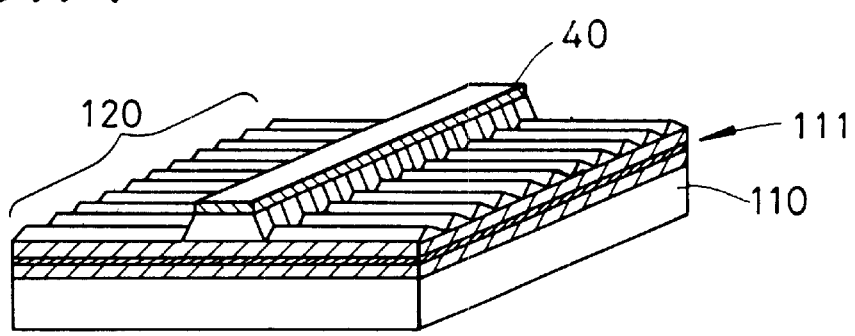

Next, as shown in FIG. 14, a step of forming gratings is carried out in which etching is performed to transform the both lateral regions into patterns of gratings 120. Then, developing and etching is carried out thereon. Since there is a difference between the thicknesses of the resist layers 117 on the top of the mask 40 and on the top of both lateral flat portions 114, only the flat top portion of the ridge stripe 115 survives the dry etching, and both lateral flat portions 114 and the active layer 111 are etched into the grating patterns.

Figure 15:
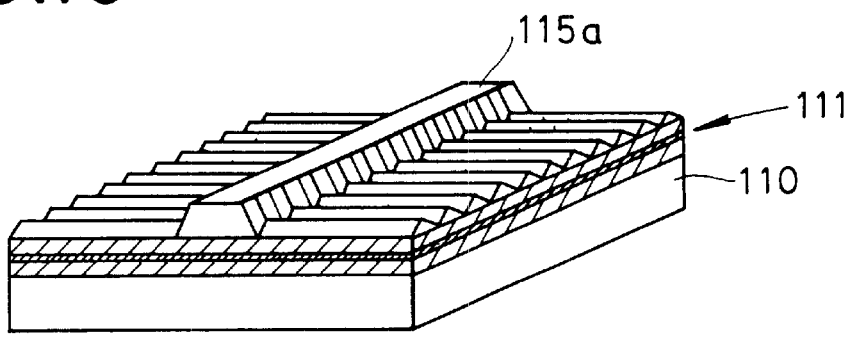

Then, as shown in FIG. 15, the mask 40 is removed to expose the flat top portion 115a.

Observation of an SEM picture taken on the resultant grating structures proves that grating structures having widths spanning the regions of the substrate on both sides of the ridge stripe and a period on the order of submicrometers are formed with uniformity maintained up to the side surfaces of the step formed by the ridge stripe.

Subsequent steps are performed similarly to those in the above-described embodiment to fabricate a non-regrowth DFB laser.

Figure 16:
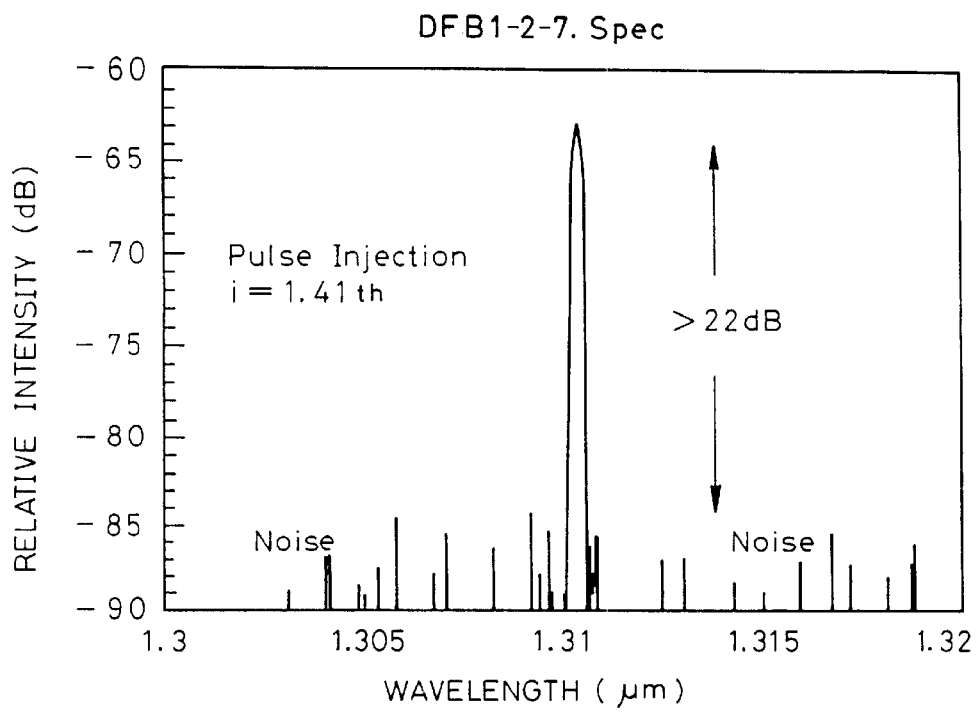
FIG. 16 is a graph showing the emission spectrum characteristics of a non-regrowth DFB semiconductor laser according to still another embodiment of the present invention.
Figure 17:
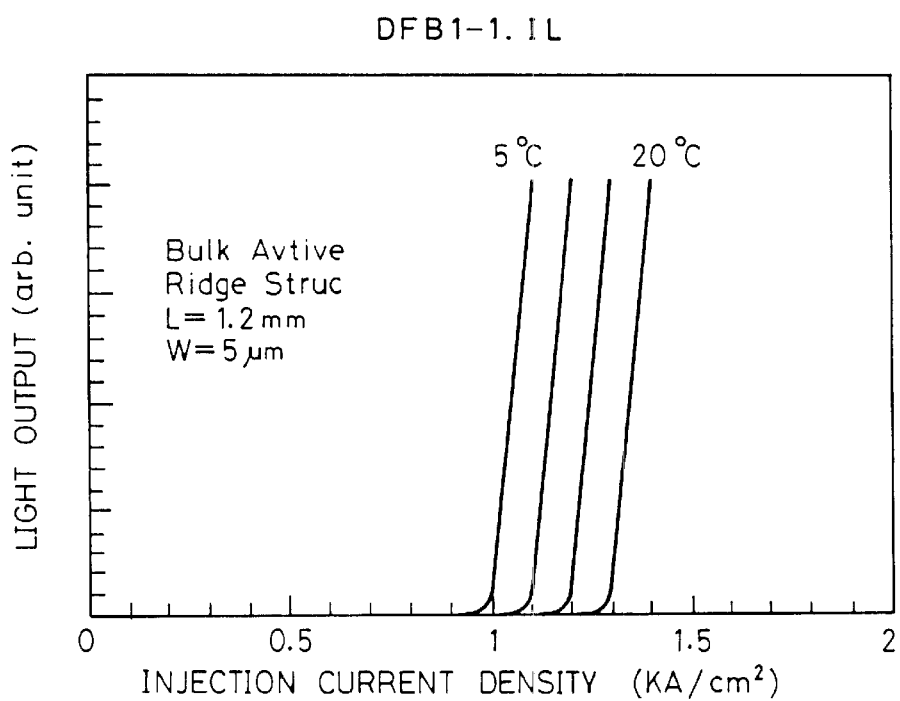
FIG. 17 is a graph showing the characteristics of an emission spectrum of a non-regrowth DFB semiconductor laser according to a further embodiment of the present invention with respect to the relationship between the current applied thereto and the intensity of light emitted therefrom.

In this second embodiment, an InGaAsP/InP laser having an active layer region of an SCH structure as in the above-described embodiment was fabricated as an example. The same examination as in the above embodiment was made on the characteristics of the resultant no-regrowth DFB semiconductor laser. FIGS. 16 and 17 show the results. FIG. 16 is a graph of spectral distribution showing the oscillation wavelength versus relative intensity. FIG. 17 is a graph showing the characteristics of the injection current density versus light output. In this laser, again, the active layer is constituted by the bulk, and the end faces are cleavage planes. The width of the ridge stripe is 5 μm. The gratings are of third order. The grating depth ranges from one-fourth to one-third of the period. It is apparent from the graphs that the non-regrowth DFB semiconductor laser thus obtained allows highly efficient injection of a current into the device and provides single mode emission.

As described above, according to the present invention, gratings having a predetermined period are formed even if a selective wet etching process as previously described is not available by leaving an etching mask to serve as a protective film when the ridge stripe is formed and by exposing patterns at predetermined intervals using a writing process to form gratings having a predetermined period by means of photolithography. No grating is formed on the top portion of the ridge stripe which is masked by the protective film to leave a smooth surface thereon, and a grating is formed in regions excluding the top portion of the ridge stripe.

As described above, the present invention makes it possible to form laterally coupled optical gratings on the regions on both sides of the ridge of a low cost non-regrowth DFB laser with high reliability or an array device for wavelength multiplex communication. Specifically, according to the present method, a mask made of $SiO_2$ or the like is left only on the top surface of a ridge stripe when a grating is transferred using dry etching. When a grating is transferred by means of selective wet etching utilizing HCl or the like, the grating is written and formed on a (100)-plane of an InP substrate by scanning electron beams in a [011]-direction.

The above-described embodiments are only illustrative of the present invention and the present invention is not limited thereto.

As a still further embodiment of a laterally coupled distributed feedback ridge type InGaAsP/Inp semiconductor laser, the dependence of coupling constant k on the grating depth, ridge width, and ridge depth (the dependence on the grating position in the direction of depth) was calculated using a typical InP based semiconductor laser having the SCH structure as described above as a model for calculation to derive the optimum conditions for these three parameters in order to increase the coupling coefficient.

The coupling coefficient k of a laterally coupled distributed feedback ridge laser significantly depends on the grating depth, the ridge width, and the ridge depth. The ridge depth is, in other words, the depth at which the bottoms of the gratings are formed. The ridge depth is determined by etching performed to form a mesa stripe during the fabrication of a device, and it is very much advantageous in fabricating the device to estimate the optimum depth and an allowance for etching errors at a designing phase.

Specifically, simulation was made to find the ridge stripe width, grating depth, and the position to form gratings that maximize the coupling coefficient.

The coupling coefficient k is calculated using the theory of coupling modes according to which the coupling coefficient of a first order grating having a rectangular section is expressed by the following expression:

$$|k|=1/(n_{eff}\lambda)\times(n_2^2-n_1^2)\times\sin(\pi\gamma)\times\Gamma$$

where $n_2$ and $n_1$ respectively represent the refractive indices of the semiconductor layer and insulating layer that constitute the grating; neff represents the effective refractive index of the waveguide; λ represents the wavelength of the beam to be guided; γ represents the duty cycle of the grating; and Γ represents the overlap integral of the grating region and the electrical field.

Figure 18:
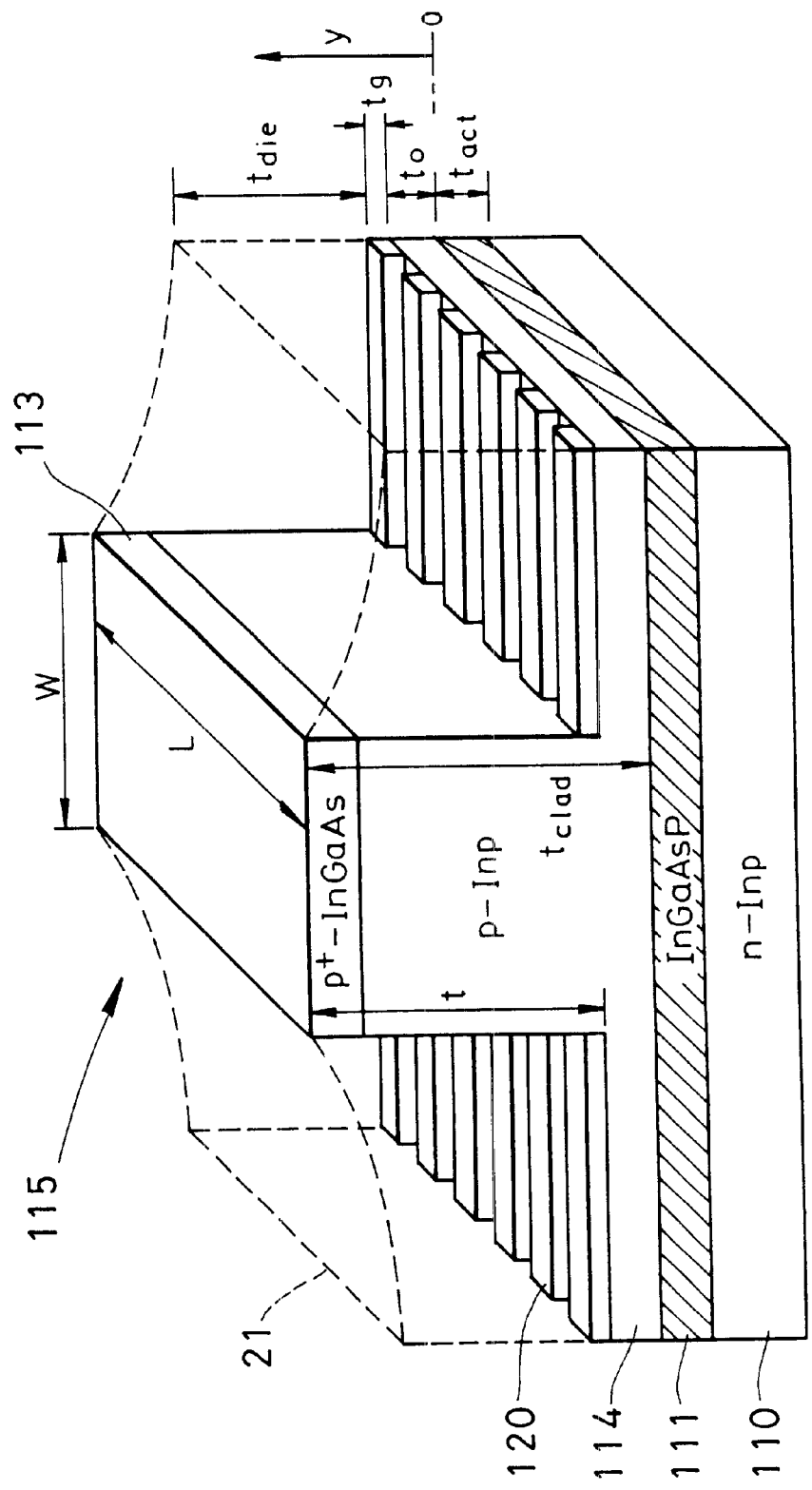
FIG. 18 is a schematic sectional view of a laterally-coupled InP based semiconductor DFB laser having an SCH structure according to a still further embodiment of the present invention.

FIG. 18 shows the parameters such as dimensions of the laterally coupled distributed feedback InP base semiconductor laser having an SCH structure. The wavelength is 1.3 μm. Let us assume that an InGaAsP waveguide layer 111 (refractive index=3.3258 and thickness=0.45 μm), flat portions 114 of p-InGaAs (refractive index=3.2001) on both sides of the ridge, i. e., the region between the bottom of gratings 120 and the InGaAsP waveguide layer, a ridge stripe 115 constituted by a main body made of P-InGaAs and a $p^+$-InGaAs contact layer, and a dielectric protective layer 21 (refractive index=1.53) are formed on an n-InP cladding layer. The thickness of the InGaAs waveguide layer 111 is represented by tact; the thickness of the ridge stripe 115 is represented by $t_{clad}$; the ridge width is represented by w; the thickness of the flat portions 114 on both sides of the ridge is represented by to; the gratings depth is represented by $t_g$; and the duty cycle of the gratings is represented by τ.

As shown in FIG. 18, the position where the gratings are formed is represented by the distance of the bottoms of the gratings from an origin (y=0) which is the upper surface of the InGaAsP waveguide layer (the interface between the InGaAsP waveguide layer 111 and the both lateral flat portions 114). If y is a positive value, the bottoms of the gratings are formed above the InGaAs waveguide layer. If y is a negative value, the bottoms of the gratings cut into the InGaAs waveguide layer. While the InGaAs waveguide layer is formed to have an SCH structure having an active layer sandwiched by a pair of guide layers, it is assumed that the refractive index $n_{act}$ is constant throughout this layer for ease of computation and that the insulating protective layer is assumed to have an infinite thickness.

(1) First, the dependence of the coupling coefficient on the grating depth was examined.

Figure 19:
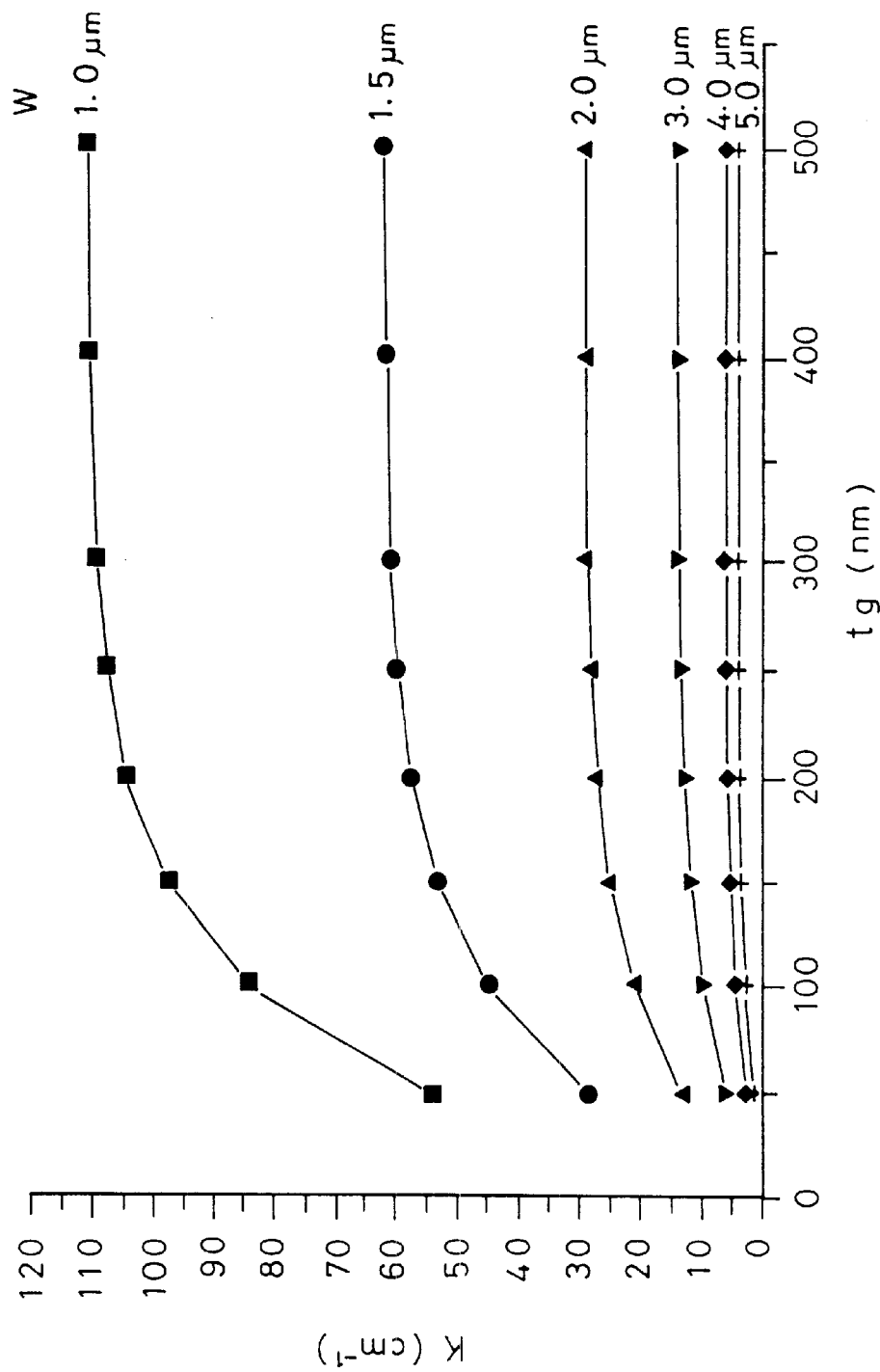
FIG. 19 is a graph showing the relationship between the first order grating depth tg and the coupling constant k of a non-regrowth DFB semiconductor laser according to still further embodiment of the present invention.

With conditions for computation that λ=1.3 μm; $n_{act}$=3.3258; $n_{die}$=1.53; $t_0$=0.0 μm; and γ=0.5, the relationship between the first order grating depths $t_g$ (50 nm, 100 nm, 150 nm, 200 nm, 250 nm, 300 nm, 400 nm and 500 nm) and the coupling coefficient k was calculated for ridge widths W of 1.0 μm, 1.5 μm, 2.0 μm, 3.0 μm, 4.0 μm and 5.0 μm. FIG. 19 is a graph showing the relationship between the first order grating depths $t_g$ and the coupling coefficient k.

FIG. 19 shows that the coupling coefficient has a tendency to saturate beyond the grating depth of about 150 nm although there is some variation depending on the ridge width W.

This yields a condition that the grating depth $t_g$ to maximize the coupling coefficient k is 150 nm or more.

(2) Next, the dependence of the coupling coefficient k on the ridge width was examined.

Figure 20:
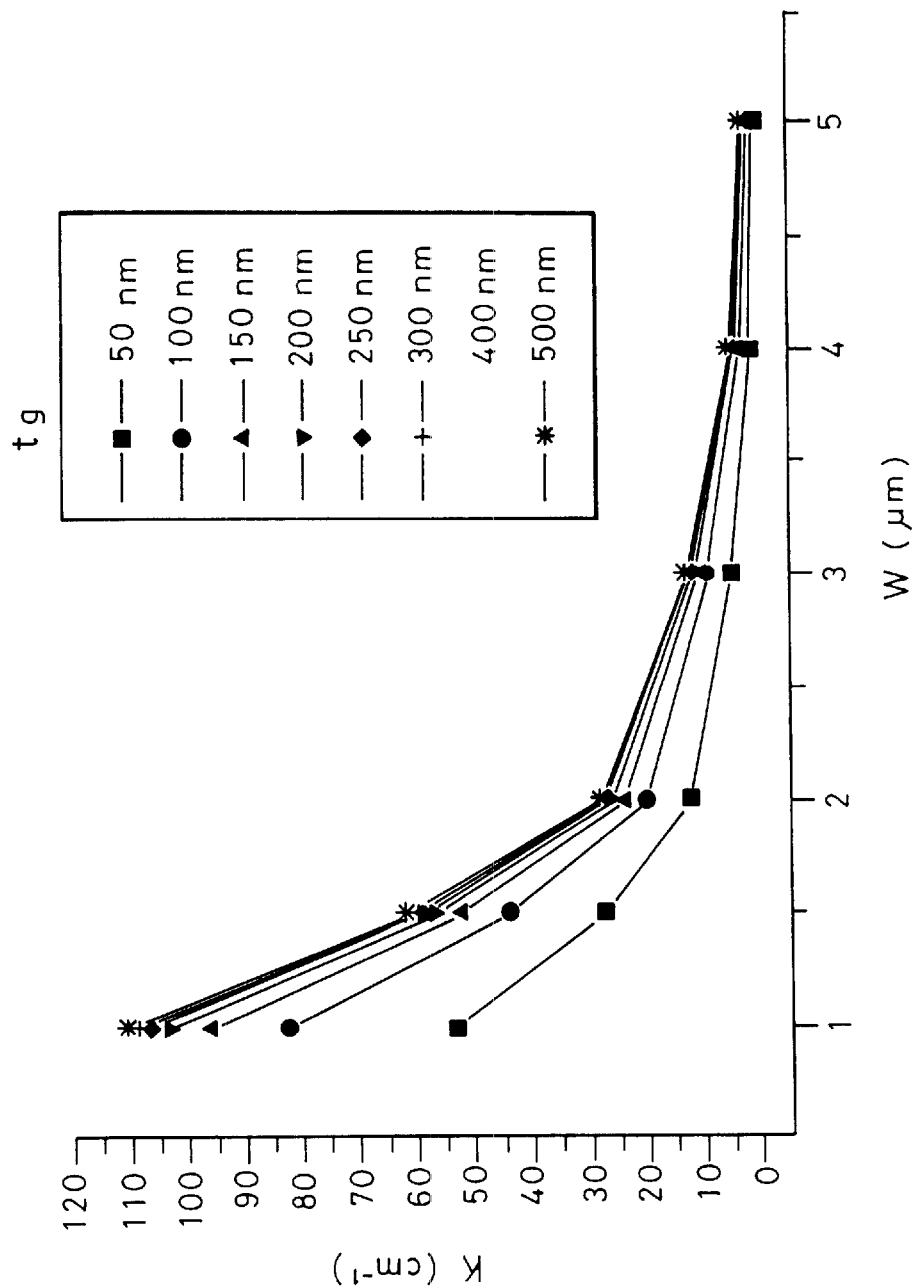
FIG. 20 is a graph showing the relationship between the ridge width W and the coupling constant k of a non-regrowth DFB semiconductor laser according to a still further embodiment of the present invention.

FIG. 20 shows the relationship between the ridge widths w and the coupling coefficient k obtained based on the result of the computation as in above (1).

It is known that a preferable DFB laser has a tendency of making satisfactory DFB mode emission if kL=1 where L represents the length of the device (ridge stripe length) and k represents the coupling coefficient. If L≈500 μm, k must be substantially equal to 20 cm$^{-1}$.

The graph in FIG. 20 shows that the coupling coefficient k is 20 cm$^{-1}$ or more when the ridge width W is 2.5 nm or less if the grating depth $t_g$ is 150 nm or more.

Therefore, a coupling coefficient needed for emission with a grating depth of 150 nm or more can be maintained if the ridge width is 2.5 μm or less.

(3) Further, the dependence of the coupling coefficient k on the grating forming position was examined.

Figure 21:
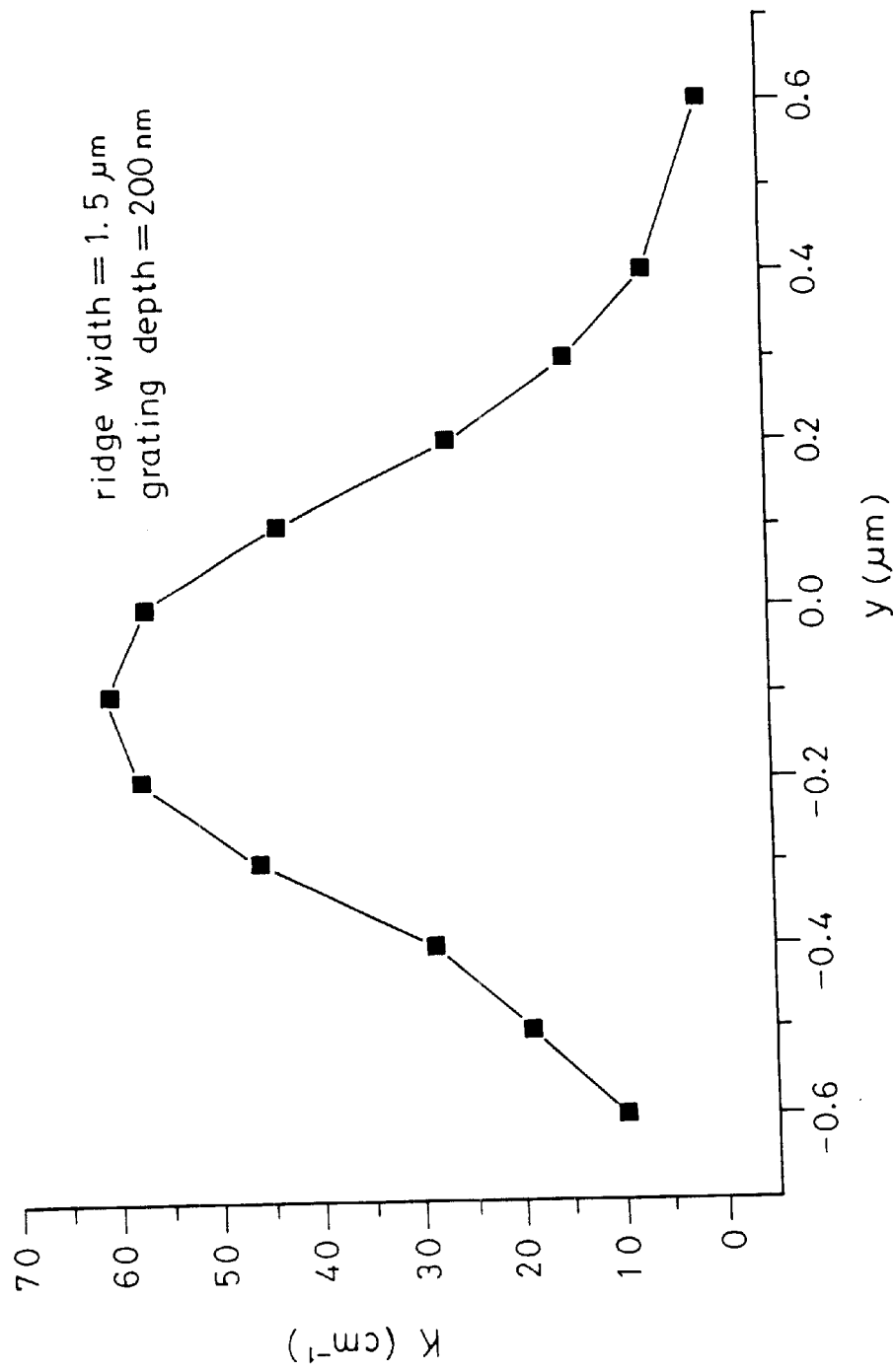
FIG. 21 is a graph showing the relationship between the position y of the first order gratings and the coupling coefficient k.

The position y of the bottoms of the first order gratings and the coupling coefficient k were calculated under the same conditions as in the above (1) except that the ridge width and grating depth were assumed to be 1.5 μm and 200 nm, respectively. FIG. 21 is a graph showing the relationship between the position y of the first order gratings and the coupling coefficient k. FIG. 21 shows that the coupling coefficient is at the maximum in the vicinity of y=-0.1 μm. The optimum range of the position y, i.e., the position where the bottoms of the gratings are formed, to increase coupling coefficient is from -0.2 to +0.1 μm taking the margin for device fabrication (there is a limit for the depth to which the InGaAsP waveguide layer can be cut).

Since the calculation is made based on an assumption that $t_{clad}$=1 μm, the position t of the bottoms of the gratings in the direction of the depth relative to the thickness $t_{clad}$ of the ridge stripe 115 (the distance between the top surface of the ridge stripe 115 and the bottoms of the gratings) is preferably in a range in which $t_{clad}$:t=10:9 to 10:12 is satisfied. Since the coordinate y of the grating position in the direction of depth from the origin (y=0) which is the upper interface of the InGaAsP waveguide layer shows positions below the interface, the lateral flat portions of InP remain when y is positive and etching extends to the InGaAs waveguide layer when y is negative.

Thus, a design that satisfies each of the conditions as described in the above (1) through (3) will allow the coupling coefficient to be increased, making it possible to provide a smaller laser device.

According to the present invention, fine gratings can be formed with high uniformity only on regions on both sides of the ride on a substrate having a ridge type waveguide structure. Since the top portion of a ridge type laser waveguide can be made smooth, it can make a better contact with an electrode. It is also possible to form a highly uniform grating structure not only on the flat portions on both sides of a ridge but also on the side walls of the ride. This makes it possible to provide a non-regrowth refractive laterally coupled ridge type InGaAsP/InP (DFB) laser which has a sufficient lateral optical coupling coefficient and which is characterized by high yield and reduced cost.

What is claimed is:

1. A method of manufacturing a distributed feedback ridge semiconductor laser, the method comprising the steps of:

forming a laser substrate along a plane normal to a first direction and comprising a cladding layer made of a material for a ridge stripe and a contact layer stacked along the first direction on an active layer;

forming two lateral flat portions from said cladding layer and contact layer to form a ridge stripe protruding from the two lateral flat portions and having a flat top portion, the ridge stripe extending along a second direction that is substantially perpendicular to the first direction;

forming a protective film and a resist layer in order to cover said lateral flat portions and said flat top portion;

forming a latent image of a grating, the latent image having a periodic structure in the second direction and developing the latent image to form a grating pattern on said resist layer, the grating pattern having a periodic structure along the second direction;

etching at least one lateral flat portion according to said grating pattern to form a grating on or in said active layer such that the grating is not formed in any region within or beneath the ridge stripe;

forming an insulating layer on the surface of said grating and said flat top portion of the ridge stripe;

performing etching to expose only said flat top portion of the ridge stripe on said insulating layer; and forming an electrode on said flat top portion.

2. A method of manufacturing a semiconductor laser according to claim 1, wherein said step of forming the latent image includes a step of performing an electron beam writing process on the resist layer.

3. A method of manufacturing a semiconductor laser according to claim 1, wherein said active layer comprises a bulk layer, a single quantum well layer, or a multiple quantum well layer composed essentially of $In_{1-x}Ga_xAs_{1-y}P_y$, (x and y represent a decimal fraction); said cladding layer comprises InP; and said contact layer comprises InGaAsP or InGaAs.

4. A method of manufacturing a semiconductor laser according to claim 1, wherein said step of forming the grating comprises selective wet etching of InP using a hydrochloric acid type etchant such that said ridge stripe substantially extends along the second direction that is perpendicular to the first direction of said laser substrate.

5. A method of manufacturing a semiconductor laser according to claim 1, wherein said step of forming the ridge stripe includes the step of forming a predetermined stripe mask on the flat top portion.

6. A method of manufacturing a semiconductor laser according to claim 1, wherein the at least one lateral flat portion is etched such that the grating is laterally coupled to a side surface of the ridge stripe.

7. A method of manufacturing a semiconductor laser according to claim 6, wherein the side surface is defined by a third direction that is perpendicular to the first and second directions.

8. A method of manufacturing a semiconductor laser according to claim 1, wherein said step of etching at least one lateral flat portion comprises a step of removing said protective film and the resist layer.

9. A method of manufacturing a semiconductor laser according to claim 1, wherein said step of etching at least one lateral flat portion comprises a step of dry etching.

10. A method of manufacturing a semiconductor laser according to claim 5, wherein said step of forming said protective film and the resist layer includes the step of forming said protective film with said stripe mask left on said flat top portion.

11. A method of manufacturing a semiconductor laser according to claim 1, wherein the step of forming the insulating layer comprises the steps of covering the surface of said grating and said flat top portion with a compound and curing the compound.

12. A method of manufacturing a semiconductor laser according to claim 1, wherein the step of forming an electrode on said flat top portion comprises producing a smooth interface between said ridge stripe and electrode.

* * * * *